United States Patent
Yazdanbakhsh

(10) Patent No.: US 11,960,805 B2
(45) Date of Patent: Apr. 16, 2024

(54) ARCHITECTURE EXPLORATION AND COMPILER OPTIMIZATION USING NEURAL NETWORKS

(71) Applicant: Google LLC, Mountain View, CA (US)

(72) Inventor: Amir Yazdanbakhsh, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/066,900

(22) Filed: Dec. 15, 2022

(65) Prior Publication Data

US 2023/0123343 A1 Apr. 20, 2023

Related U.S. Application Data

(63) Continuation of application No. 17/225,946, filed on Apr. 8, 2021, now Pat. No. 11,556,684.

(60) Provisional application No. 63/007,855, filed on Apr. 9, 2020.

(51) Int. Cl.
| | |
|---|---|
| *G06F 8/30* | (2018.01) |
| *G06F 8/41* | (2018.01) |
| *G06F 30/27* | (2020.01) |
| *G06F 30/337* | (2020.01) |
| *G06N 3/045* | (2023.01) |

(52) U.S. Cl.
CPC ............... *G06F 30/27* (2020.01); *G06F 8/41* (2013.01); *G06F 30/337* (2020.01); *G06N 3/045* (2023.01)

(58) Field of Classification Search
CPC .......... G06F 30/27; G06F 8/41; G06F 30/337; G06F 8/37; G06N 3/045; G06N 3/047; G06N 3/088
See application file for complete search history.

(56) References Cited

U.S. PATENT DOCUMENTS

2020/0293497 A1* 9/2020 Wu .................. G06N 3/045

FOREIGN PATENT DOCUMENTS

CA 3090759 A1 * 8/2019 ............. G06N 20/00

* cited by examiner

*Primary Examiner* — Nghia M Doan
(74) *Attorney, Agent, or Firm* — Fish & Richardson P.C.

(57) ABSTRACT

Methods, systems, and apparatus, including computer programs encoded on a computer storage medium, for optimizing integrated circuit architectures or compiler designs using an optimization engine. The optimization engine includes an auto-encoder and one or more regressors. Once trained, the optimization engine can encode initial, discrete input values of a set of input characteristics into a continuous domain and use continuous optimization techniques to identify final input values of the set of input characteristics that optimize one or more output characteristics.

20 Claims, 6 Drawing Sheets

ARCHITECTURE EXPLORATION AND COMPILER OPTIMIZATION USING NEURAL NETWORKS

CROSS-REFERENCE TO RELATED APPLICATION

This application is a continuation of U.S. application Ser. No. 17/225,946, filed on Apr. 8, 2021, which claims priority to U.S. Provisional Application No. 63/007,855, filed on Apr. 9, 2020. The disclosure of the prior applications are considered part of and are incorporated by reference in the disclosure of this application.

BACKGROUND

This specification relates to optimizing integrated circuit architectures or compiler designs using neural networks.

Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from a received input in accordance with current values of a respective set of weights.

SUMMARY

This specification describes a system implemented as computer programs on one or more computers in one or more locations that optimizes integrated circuit architectures or compiler designs using an optimization engine. The optimization engine includes an auto-encoder and one or more regressors. In particular, the system can determine respective final values for a set of input characteristics of an integrated circuit (IC). The final values generally optimize corresponding performance of the IC that is measured with reference to one or more output characteristics. Additionally, the system can be similarly configured to determine a final intermediate representation for a computer program, such that when executed in accordance with the final intermediate representation, the corresponding performance of the computer program can be optimized.

The subject matter described in this specification can be implemented in particular embodiments so as to realize one or more of the following advantages. IC architecture exploration typically involves identifying, from one or more discrete sets of possible values, respective final values for a set of IC input characteristics which include, for example, bandwidth, memory, and compute. Corresponding performance of an IC having properties specified by the respective final values of the input characteristics can then be measured with respect to one or more output characteristics. An issue common to such process is that the respective values of the output characteristics that are estimated using heuristic-based approaches may be inaccurate and thus do not fully reflect the actual performance of the IC. Trying to identify respective final values for the set of IC input characteristics has further difficulties, for example, because performing optimization in the discrete domain can be subject to combinatorial explosion. In other words, when the set of possible values has a substantial size (i.e., includes thousands or millions of possible values), discrete optimization techniques which involve exhaustive enumeration of all possible combinations of possible values typically fail to make efficient use of computational resources (e.g., memory, computing power, or both).

This specification, however, describes techniques for using an IC optimization system to encode the discrete variables into a latent representation which specifies a continuous distribution of latent variables and perform optimization processes, i.e., in the latent space, using any appropriate continuous optimization technique to generate one or more improved representations which can in turn optimize a predicted performance of the IC. Specifically, IC performance can be predicted using respective regressor models that are trained on labeled training data and are configured to process a latent representation and generate corresponding predicted values of the output characteristics of the IC. Once the improved latent representations have been generated, the system can proceed to decode a selected improved latent representation into an output which specifies respective final input values of the set of IC input characteristics in the discrete domain.

In general, when identifying final input values, performing continuous optimization can save the substantial amount of computational resources (e.g., memory, computing power, or both) that is otherwise required for discrete optimization processes. Additionally, respective values of the output characteristics predicted by the regressor models are more accurate, i.e., compared to those generated using heuristic-based approaches, and therefore can lead to better solutions to IC architecture exploration problems.

Further, the described techniques can be similarly applied to compiler optimization problems and allow for a compiler optimization system to efficiently identify final intermediate representation for a given computer program, such that corresponding performance of the given computer program can be optimized when executed in accordance with the intermediate representation.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
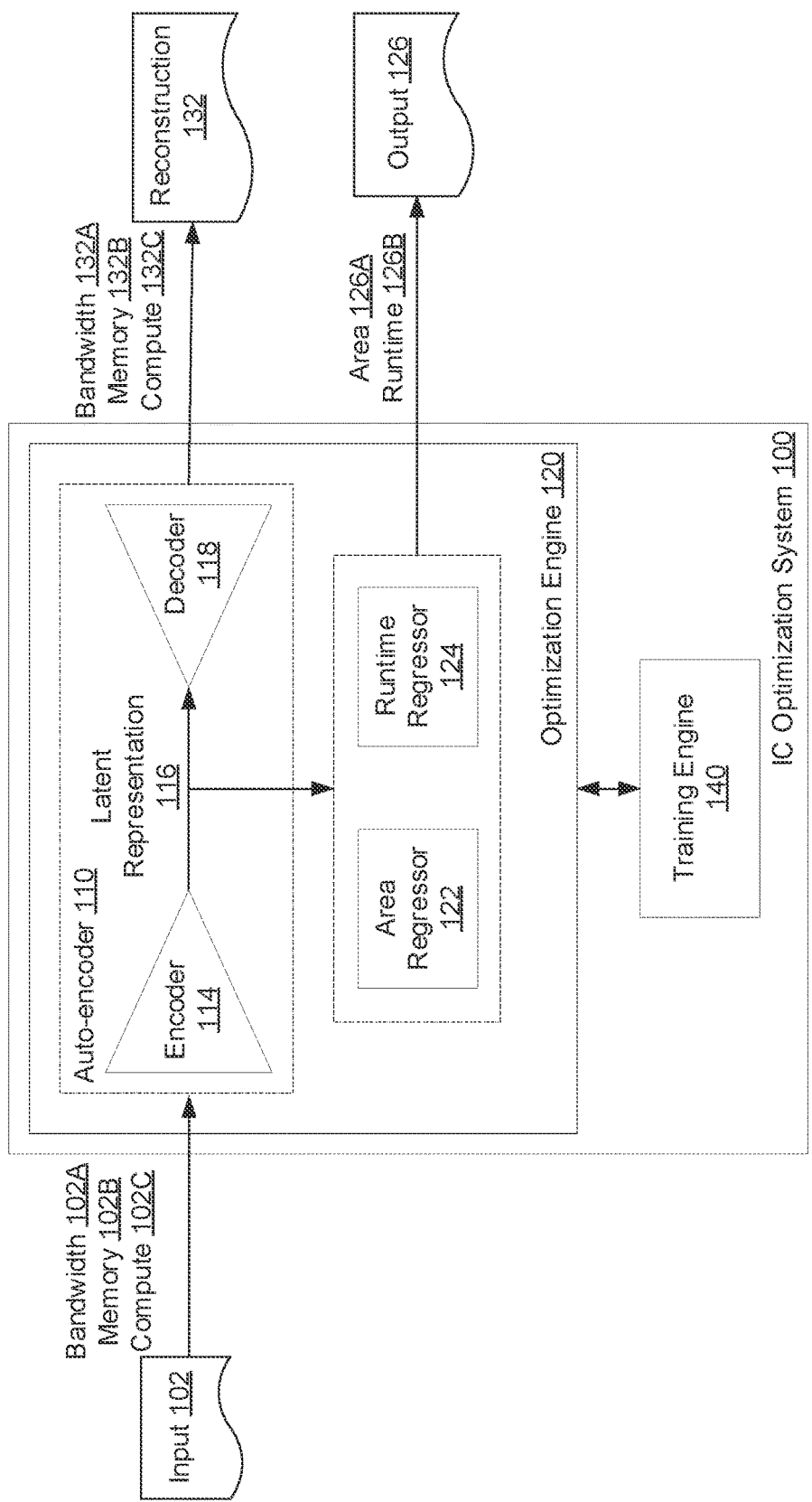
FIG. 1 is a block diagram of an example integrated circuit (IC) design optimization system.

FIG. 1 is a block diagram of an example integrated circuit (IC) optimization system 100. The IC optimization system 100 is an example of a system implemented as computer programs on one or more computers in one or more locations, in which the systems, components, and techniques described below are implemented.

The IC optimization system 100 is configured to receive an input 102 which specifies respective input values for a set of input characteristics of an IC and process that input using an optimization engine 120 to generate a reconstruction 132 of the input 102. Each input value is typically a discrete (e.g., integer) variable.

The integrated circuit (IC) can, by way of example, be (at least a part of) a general purpose hardware circuit, a special purpose hardware circuit that is configured to perform specialized computations, e.g., graphics processing units ("GPUs"), field-programmable gate arrays ("FGPAs"), and application-specific integrated circuits ("ASICs"), including tensor processing units ("TPUs"), or any other kind of central processing unit.

In some implementations, the set of input characteristics of the IC includes bandwidth, memory, and compute. In such implementations, as shown in FIG. 1, the input 102 specifies respective input values for bandwidth 102A, memory 102B, and compute 102C.

The optimization engine 120 performs this reconstruction using an auto-encoder 110 which includes an encoder 114 and a decoder 118. The encoder 114 and the decoder 118 are each a respective neural network that includes one or more respective neural network layers.

More specifically, the auto-encoder 110 is configured as a variational auto-encoder (VAE). The variational auto-encoder (VAE) can force the generated latent representations 116 to have specific distributions that are generally continuous, allowing easy sampling and interpolation. Example VAE architectures are described in greater detail in Diederik P. Kingma and Max Welling, *An Introduction to Variational Autoencoders*, available at https://arxiv.org/pdf/1906.02691.pdf.

The encoder 114 is configured to process the set of input characteristics each having a respective input value in accordance with current values of encoder network parameters to generate a latent representation 116 based on the input 102. The latent representation 116 consists of structured data which in turn includes a fixed number data elements that reside in a pre-determined continuous space, i.e., a latent space. For example, each latent representation 116 can be a multi-dimensional array of numeric values. In other words, the encoder 114 can generate different latent representations 116 which represent the set of input characteristics each having different input values in the latent space.

The decoder 118 is configured to process the generated latent representation 116 in accordance with current values of decoder network parameters to generate a reconstruction 132 of the input 102. In particular, the input 102 and the reconstruction 132 include the same set of input characteristics. The reconstruction 132 specifies respective reconstructed values for the set of input characteristics.

To generate an output 126 which measures a performance of the IC, the IC optimization system 100 also provides the generated latent representation 116 to one or more regressors that are included in the optimization engine 120, as indicated by the arrow in FIG. 1. The one or more regressors are each a respective machine learning model having a plurality of model parameters. The machine learning model can have any appropriate machine learning model architecture. For example, the machine learning model may be a neural network model, a random forest model, a support vector machine (SVM) model, a linear model, or a combination thereof. Although two regressors are depicted in FIG. 1 for convenience, the optimization engine 120 may include more or less regressors.

In general, each regressor is configured to process the latent representation 116 in accordance with current values of the regressor parameters to generate a respective predicted value for a corresponding output characteristic of the IC.

In some implementations, the output characteristics of the IC include area and runtime. In such implementations, as shown in FIG. 1, the system 100 can provide the latent representation 116 to a first regressor, e.g., an area regressor 122, and a second regressor, e.g., a runtime regressor 124. The regressors 122 and 124 are configured to process the latent representation 116 to generate predicted values for area and runtime of the IC, respectively.

The IC optimization system 100 also includes a training engine 140 that is configured to train the optimization engine 120 on training data by updating respective values of the parameters of the optimization engine 120, including the set of parameters of the encoder 114, the set of parameters of the decoder 118, and respective sets of parameters of the regressors 122 and 124.

In some implementations, the system 100 generates the training data using an IC performance simulator. The training data includes a plurality of training examples. The simulator is software that is configured to measure a simulated performance of the IC having properties specified by respective input values of a set of input characteristics. Thus, to generate the plurality of training examples, the system can repeatedly provide as input to the simulator different input values of the set of input characteristics and obtain as output from the simulator respective simulated values of the one or more output characteristics. The different input values can be determined, for example, by performing sampling within a corresponding discrete distribution of possible values for each input characteristic. In particular, when generating training data, the simulated values of the output characteristics are referred to as ground truth values of the output characteristics.

Briefly, the training engine 140 trains the auto-encoder 110 to generate high quality latent representations, and in turn, high quality reconstructions that are as close to inputs as possible. The training engine 140 also trains the one or more regressors to more accurately predict respective values of the output characteristics.

Training the optimization engine 120 is described in greater detail below with reference to FIG. 2A.

Once being trained, the system 100 can use the optimization engine 120 and the generated latent representations to determine final input values for the set of input characteristics. Additionally or alternatively, the system 100 can receive, i.e., from a user of the system, respective initial input values for the set of input characteristics of an IC and use the optimization engine 120 to identify respective final input values of the set of input characteristics of the IC based on the initial input values. In some implementations, the final input values correspond to optimal values which in turn optimize the one or more output characteristics of the IC. That is, the system can receive the initial input values from the user and use them as initial guesses for performing one or more optimization steps to modify the initial input values to optimize the IC output characteristics.

The system 100 can receive the set of input values of the set of input characteristics of the IC in any of a variety of ways. For example, the system 100 can receive the input values as an upload from a remote user of the system over a data communication network, e.g., using an application programming interface (API) made available by the system 100. As another example, the system 100 can receive an input from a user specifying which data that is already maintained by the system 100 should be used as the set of input values.

Identifying respective final input values of the set of input characteristics of the IC using the optimization engine 120 is described in greater detail below with reference to FIG. 2B.

Figure 2A:
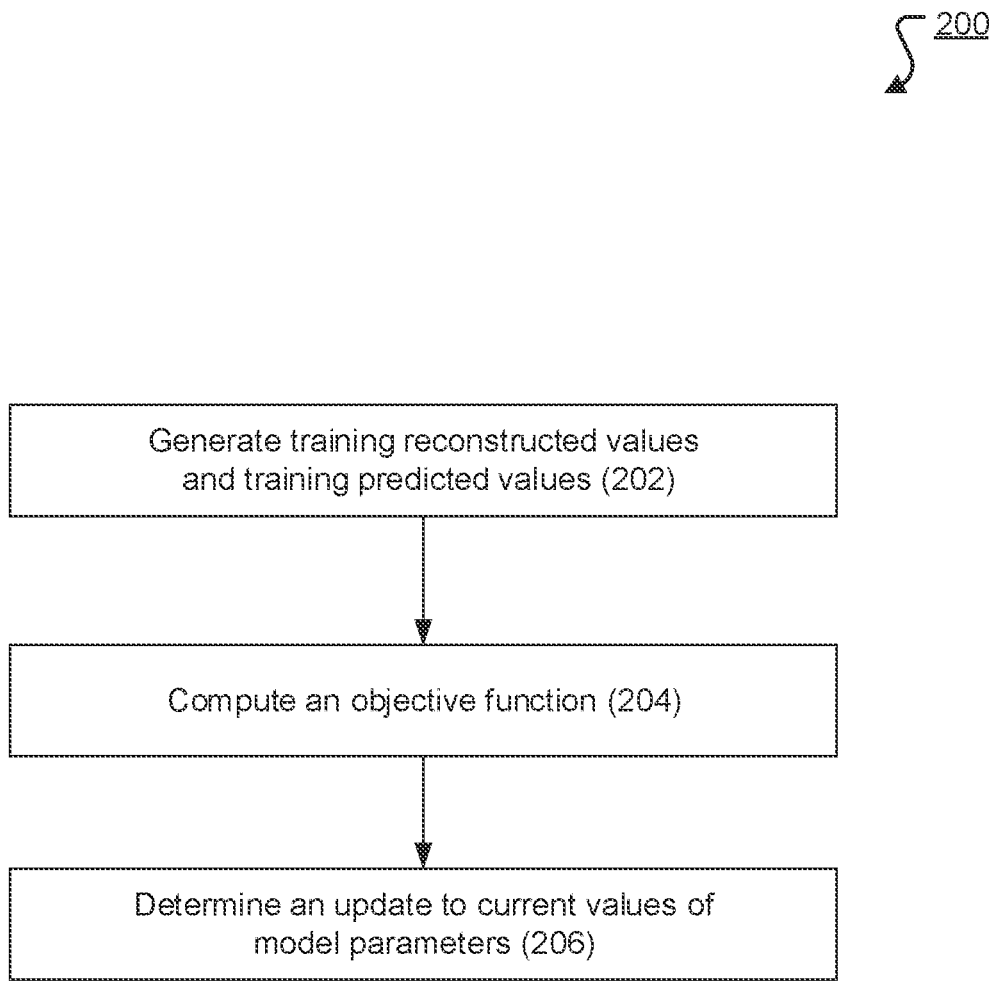
FIG. 2A is a flow diagram of an example process for training an IC design optimization engine.

FIG. 2A is a flow diagram of an example process 200 for training an IC design optimization engine 120. For convenience, the process 200 will be described as being performed by a system of one or more computers located in one or more locations. For example, a system, e.g., the IC optimization system 100 of FIG. 1, appropriately programmed in accordance with this specification, can perform the process 200.

In general, the system can repeatedly perform the process 200 for different training examples to train the optimization engine by repeatedly updating the parameter values of the optimization engine. Each training example specifies respective input values of a set of input characteristics of an IC. Each training example is also associated with respective ground truth values of the one or more output characteristics.

The system generates respective training reconstructed values (202) of the set of input characteristics and respective training predicted values of the output characteristics. The input characteristics include bandwidth, memory, and compute. The output characteristics include area and runtime.

The system can process the training example using the encoder to generate a latent representation based on the set of input characteristics of an IC that is specified by the training example. As described above, each latent representation typically consists of structured data (e.g., a multi-dimensional array of numeric values) that resides in the latent space. The system then processes the latent representation using the decoder to generate a reconstruction which includes respective training reconstructed values of the set of input characteristics specified by the training example.

The system also processes the latent representation using the regressors to generate respective training predicted values of the output characteristics of the IC. Specifically, each regressor is configured to process the generated latent representation in accordance with current values of regressor parameters to generate a predicted value of a corresponding output characteristic.

The system computes a training objective function (204) that evaluates (i) a difference between the respective training reconstructed values and the input values of the set of input characteristics and (ii) a difference between the respective training predicted values and ground truth values of the output characteristics. In general, the system can evaluate respective measures of difference using any suitable loss metrics, including, for example, mean squared error (MSE) losses or mean absolute error (MAE) losses.

The system determines an update to current values of parameters of the optimization engine (206) based on a computed gradient of the training objective function. In particular, the system computes the gradient of the training objective function with respect to the parameters of the optimization engine.

The system then proceeds to update the current parameter values based on the gradient using an appropriate machine learning training technique (e.g., stochastic gradient descent, Adam, or rmsProp). Alternatively, the system only proceeds to update the current parameter values once the process 200 has been performed for an entire mini-batch of training examples. A mini-batch generally includes a fixed number of training examples, e.g., 16, 64, or 256. In other words, the system combines, e.g., by computing a weighted or unweighted average of, respective gradients that are determined during the fixed number of iterations of process 200 and proceeds to update the current parameter values based on the combined gradient.

After training has terminated, e.g., after a specified number of training processes have been performed or after the gradient of the training objective function has converged to a specified value, the system can proceed to use the trained optimization engine to identify respective final input values of a set of input characteristics of the IC.

Figure 2B:
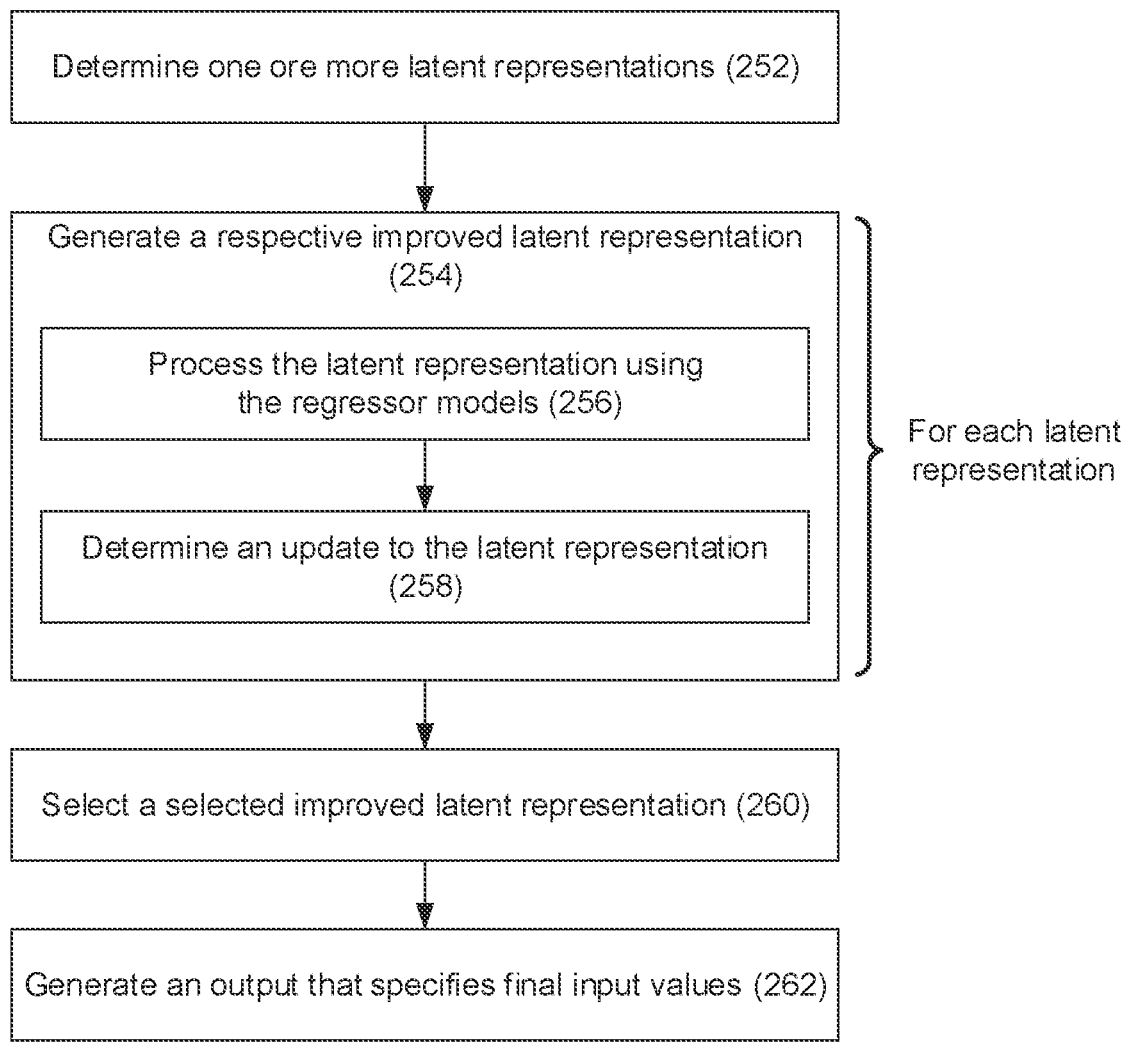
FIG. 2B is a flow diagram of an example process for identifying respective final input values of a set of input characteristics of an integrated circuit.

FIG. 2B is a flow diagram of an example process 250 for identifying respective final input values of the set of input characteristics of an integrated circuit. For convenience, the process 250 will be described as being performed by a system of one or more computers located in one or more locations. For example, a system, e.g., the IC optimization system 100 of FIG. 1, appropriately programmed in accordance with this specification, can perform the process 250.

The system determines one or more latent representations (252) in the latent space. For example, the system initializes one or more latent representations that need to be improved with some measure of randomness. The system can do so by performing sampling within the latent space.

The system generates a respective improved latent representation (254) for each of the one or more latent representations.

Briefly, for each of the one or more latent representations, generating a corresponding improved latent representation involves performing one or more improvement steps. Each improvement step in turn includes processing the latent representation using the regressors (256) and determining an update to the latent representation (258).

More specifically, the system processes the latent representation using the regressors (256) to generate respective predicted values of the one or more output characteristics of the IC (as of the improvement step).

The system then determines an update to the latent representation (258) that improves the respective predicted values of the output characteristics generated by the regressors.

Specifically, in implementations where in IC output characteristics include area and runtime, the system computes an improvement objective function (as of the improvement step) which evaluates (i) a measure of difference between the predicted value and the desired value of the area, and (ii) a measure of difference between predicted value and the desired value of the runtime. The desired values can be either fixed or adjustable, i.e., by a user of the system. In various scenarios, the output characteristics can have different impact on the IC performance. To better account for such differences, when computing the improvement objective function, the system can assign different weights to the respective measures of difference.

Because the latent representation is in a continuous domain, the system can then perform the improvement by using an appropriate continuous optimization technique and based on a determined gradient of the improvement objective function. Stochastic gradient descent (SGD) algorithm, Newton methods, or Newton-like methods are example of such continuous optimization techniques. The system computes the gradient of the improvement objective function with respect to the latent variables specified by the latent representation.

After the one or more improvement steps have been performed for each of the one or more sampled latent representations, i.e., after generating one or more improved latent representations, the system can proceed to select (260) a selected improved latent representation from the one or more improved latent representations.

In some implementations, the selected improved latent representation corresponds to the improved latent representation from which the respective predicted values of the output characteristics generated by the regressors can satisfy one or more predetermined criteria. For example, one criterion may specify that the predicted values of either area, runtime, or both have to be below respective predetermined thresholds. As another example, one criterion may specify that the predicted values of either area, runtime, or both have to be improved at least by a predetermined amount when compared with the initial values predicted from the corresponding latent representation before improvement.

The system generates an output that specifies respective final input values of the set of input characteristics (262). The system can do so by processing the selected improved latent representation using the decoder. Specifically, the decoder processes the selected improved latent representation to generate an output that specifies respective final values of the set of input characteristics of the IC. The final values may, and generally will, be different from the input values that are specified by the received input.

Figure 3:
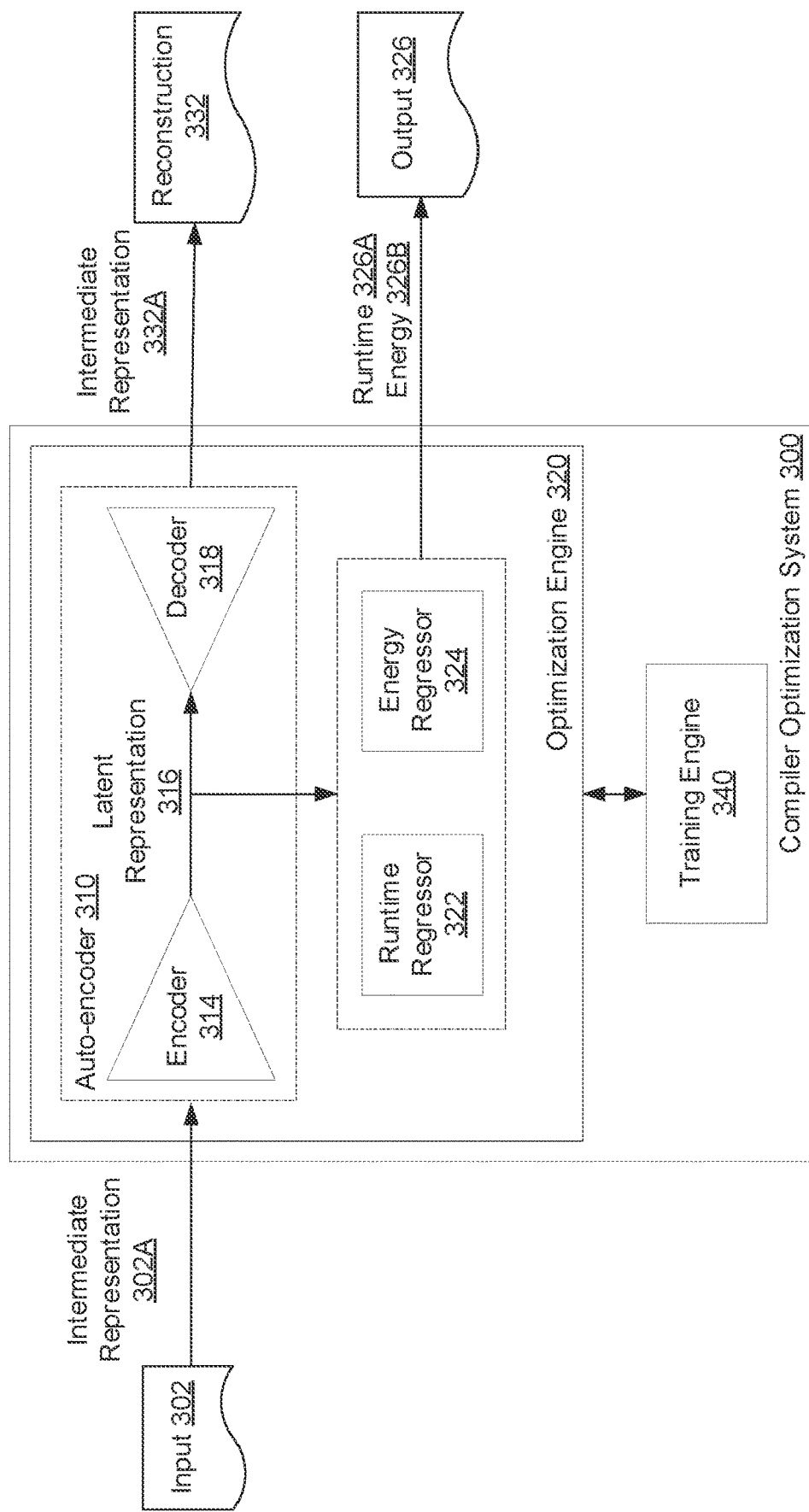
FIG. 3 is a block diagram of an example compiler optimization system.

FIG. 3 is a block diagram of an example compiler optimization system 300. The compiler design optimization system 300 is an example of a system implemented as computer programs on one or more computers in one or more locations, in which the systems, components, and techniques described below are implemented.

The compiler design optimization system 300 is configured to receive an input 302 which includes data specifying a computer program and process that input using an optimization engine 320 to generate a reconstruction 332 of the input 302.

In some implementations, the data specifying a computer program is an intermediate representation (IR) that is used internally by a compiler to represent the computer program. In such implementations, as shown in FIG. 3, the input 302 includes data specifying an intermediate representation 302A. The compiler is a computer program that translates source code from a high-level programming language into a lower level language (e.g., assembly language, object code, or machine code) to create an executable program that can actually be executed by target hardware. During this translation process, the compiler can generate different intermediate representations based on processing the computer program or any preceding intermediate representation. As such, each intermediate representation typically characterizes the information that the compiler has derived from the computer program. For example, the intermediate representation can be an abstract syntax tree, a directed acyclic graph, or a data-flow graph (DFG).

The optimization engine 320 performs this reconstruction using an auto-encoder 310 which includes an encoder 314 and a decoder 318. The encoder 314 and the decoder 318 are each a respective neural network that includes one or more respective neural network layers.

More specifically, the auto-encoder 310 is configured as a variational auto-encoder (VAE). The variational auto-encoder (VAE) can force the generated latent representations 316 to have specific distributions that are generally continuous, allowing easy sampling and interpolation. Example VAE architectures are described in greater detail in Diederik P. Kingma and Max Welling, *An Introduction to Variational Autoencoders*, available at https://arxiv.org/pdf/1906.02691.pdf.

The encoder 314 is configured to process the set of input characteristics each having a respective input value in accordance with current values of encoder network parameters to generate a latent representation 316 based on the input 302. The latent representation 316 consists of structured data which in turn includes a fixed number data elements that reside in a pre-determined continuous space, i.e., a latent space. For example, each latent representation 316 can be a multi-dimensional array of numeric values. In other words, the encoder 314 can generate different latent representations 316 which represent different intermediate representations in the latent space.

The decoder 318 is configured to process the generated latent representation 316 in accordance with current values of decoder network parameters to generate a reconstruction 332 of the input 302. In particular, the input 302 and the reconstruction 332 include data specifying the same computer program.

To generate an output 326 which measures a performance of the computer program, the compiler optimization system 300 also provides the generated latent representation 316 to one or more regressors that are included in the optimization engine 320, as indicated by the arrow in FIG. 3. The one or more regressors are each a respective machine learning model having a plurality of model parameters. The machine learning model can have any appropriate machine learning model architecture. For example, the machine learning model may be a neural network model, a random forest model, a support vector machine (SVM) model, a linear model, or a combination thereof. Although two regressors are depicted in FIG. 3 for convenience, the optimization engine 320 may include more or less regressors.

In general, each regressor is configured to process the latent representation 316 in accordance with current values of the regressor parameters to generate a respective predicted value for a corresponding output characteristic of the computer program.

In some implementations, the output characteristics that measure a performance of the computer program include runtime and energy consumption. In such implementations, as shown in FIG. 1, the system 100 can provide the latent representation 316 to a first regressor, e.g., a runtime regressor 322, and a second regressor, e.g., an energy regressor 324. The regressors 322 and 324 are configured to process the latent representation 316 to generate predicted values for runtime and energy consumption, respectively.

The compiler optimization system 300 also includes a training engine 340 that is configured to train the optimization engine 320 on training data by updating respective values of the parameters of the optimization engine 320, including the set of parameters of the encoder 314, the set of parameters of the decoder 318, and respective sets of parameters of the regressors 322 and 324.

In some implementations, the system 300 generates the training data by using a compiler to generate a plurality of intermediate representations to be used as different training examples. As described above, the compiler is a computer program that translates source code from a high-level programming language into a lower level language (e.g., assembly language, object code, or machine code) to create an executable program that can actually be executed by target hardware. To generate the plurality of training examples, the system can repeatedly use the compiler to process different computer programs and to generate respective intermediate representations. Meanwhile, the system can measure, or be told, a performance of the computer program when executed in accordance with the intermediate representation. The performance is typically measured using one or more output characteristics including, for example, runtime and energy consumption. In particular, when generating training data, the measured values of the output characteristics are referred to as ground truth values of the output characteristics.

Briefly, the training engine 340 trains the auto-encoder 310 to generate high quality latent representations, and in turn, high quality reconstructions that are as close to inputs as possible. The training engine 340 also trains the one or more regressors to more accurately predict respective values of the output characteristics.

Training the optimization engine 320 is described in greater detail below with reference to FIG. 4A.

Once being trained, the system 300 can receive, i.e., from a user of the system, an input which includes data specifying a computer program and use the optimization engine 320 to generate a final intermediate representation of the computer program. In some implementations, the final intermediate representation is the intermediate representation that is to be generated by a compiler for a computer program and that optimizes one or more characteristics that measure a performance of the computer program when being executed in accordance with the intermediate representation.

The system 300 can receive the input in any of a variety of ways. For example, the system 300 can receive the input as an upload from a remote user of the system over a data communication network, e.g., using an application programming interface (API) made available by the system 300. As another example, the system 300 can receive an input from a user specifying which data that is already maintained by the system 300 should be used as the input.

Determining the final intermediate representation using the optimization engine 320 is described in greater detail below with reference to FIG. 4B.

Figure 4A:
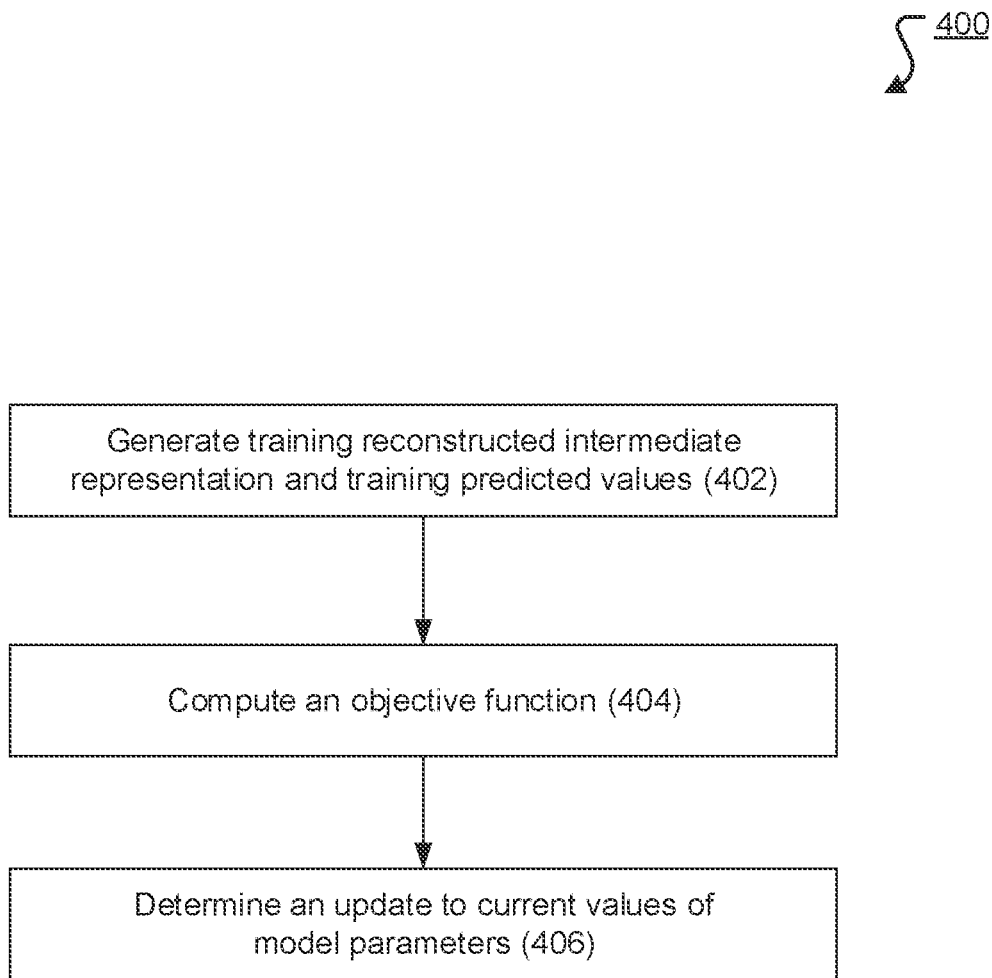
FIG. 4A is a flow diagram of an example process for training a compiler optimization engine.

FIG. 4A is a flow diagram of an example process 400 for training a compiler optimization engine 320. For convenience, the process 400 will be described as being performed by a system of one or more computers located in one or more locations. For example, a system, e.g., the compiler optimization system 300 of FIG. 3, appropriately programmed in accordance with this specification, can perform the process 400.

In general, the system can repeatedly perform the process 400 for different training examples that each specifies a respective intermediate representation of a computer program in order to train the optimization engine by repeatedly updating the parameter values of the optimization engine. Each training example is also associated with respective ground truth values of the one or more output characteristics.

The system generates a training reconstructed intermediate representation and respective training predicted values of the one or more output characteristics (402).

The system can process the training example using the encoder to generate a latent representation based on the intermediate representation that is specified by the training example. As described above, each latent representation typically consists of structured data (e.g., a multi-dimensional array of numeric values) that resides in the latent space. The system then processes the latent representation using the decoder to generate a reconstruction of the intermediate representation that is specified by the training example.

The system also processes the latent representation using the regressors to generate respective training predicted values of the output characteristics. Specifically, each regressor is configured to process the generated latent representation in accordance with current values of the regressor parameters to generate a predicted value of a corresponding output characteristic.

The system computes a training objective function (404) that evaluates (i) a difference between the training reconstructed intermediate representation and the intermediate representation specified by the training example (ii) a difference between the respective training predicted values and ground truth values of the one or more output characteristics. In general, the system can evaluate respective measures of difference using any suitable loss metrics, including, for example, mean squared error (MSE) losses or mean absolute error (MAE) losses.

The system determines an update to current values of parameters of the optimization engine (406) based on a computed gradient of the training objective function. In particular, the system computes the gradient of the training objective function with respect to the parameters of the optimization engine.

The system then proceeds to update the current parameter values based on the gradient using an appropriate machine learning training technique (e.g., stochastic gradient descent, Adam, or rmsProp). Alternatively, the system only proceeds to update the current parameter values once the process 400 has been performed for an entire mini-batch of training examples. A mini-batch generally includes a fixed number of training examples, e.g., 16, 64, or 256. In other words, the system combines, e.g., by computing a weighted or unweighted average of, respective gradients that are determined during the fixed number of iterations of process 400 and proceeds to update the current parameter values based on the combined gradient.

After training has terminated, e.g., after a specified number of training processes have been performed or after the gradient of the training objective function has converged to a specified value, the system can proceed to use the trained optimization engine to identify a final intermediate representation for a given computer program. The given computer program can be any computer program for which a corresponding final intermediate representation needs to be determined.

Figure 4B:
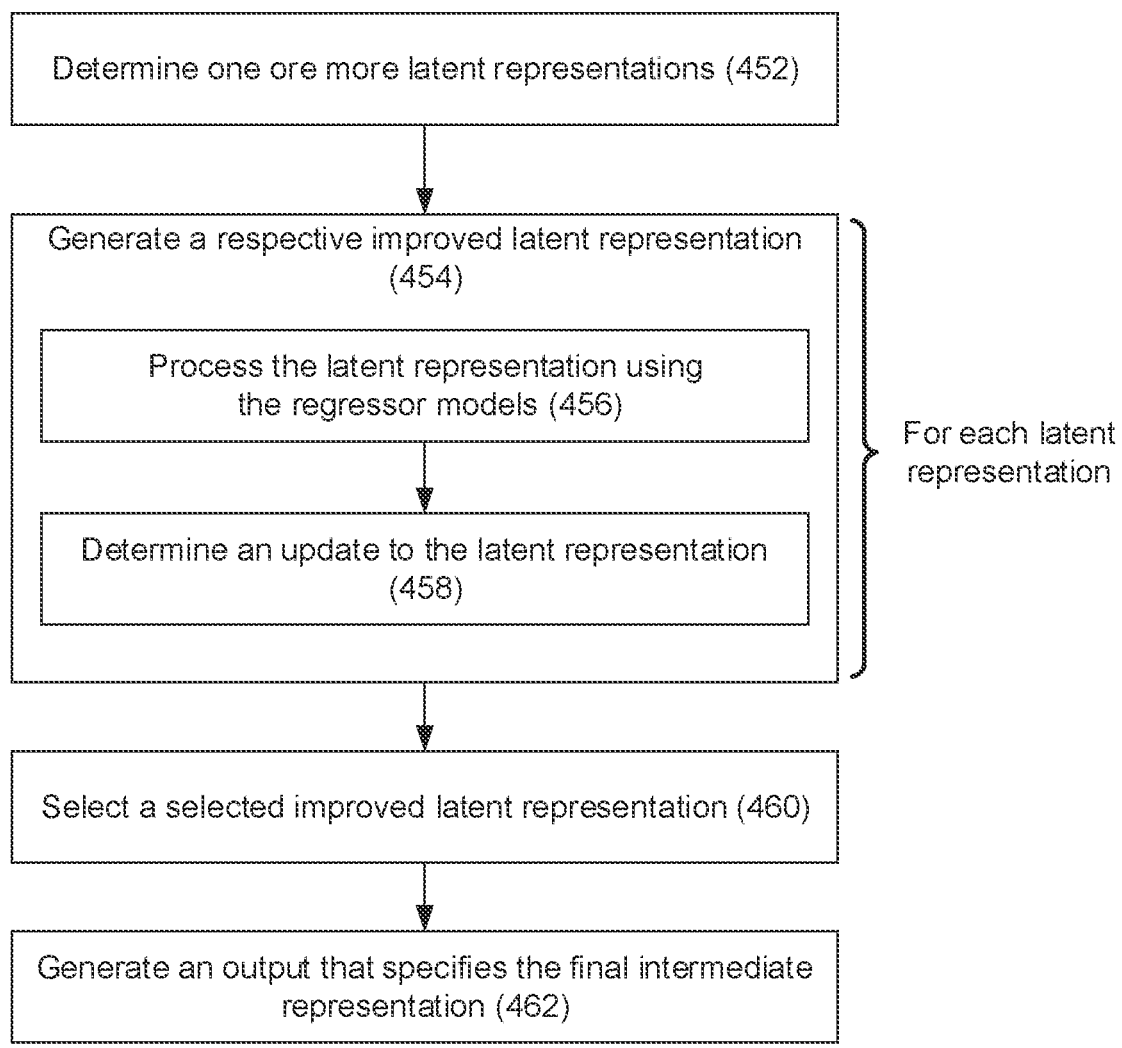
FIG. 4B is a flow diagram of an example process for identifying a final intermediate representation of a computer program.

FIG. 4B is a flow diagram of an example process 450 for identifying respective final input values of the set of input characteristics of an integrated circuit. For convenience, the process 450 will be described as being performed by a system of one or more computers located in one or more locations. For example, a system, e.g., the compiler optimization system 300 of FIG. 3, appropriately programmed in accordance with this specification, can perform the process 450.

The system determines one or more latent representations (452) in the latent space. For example, the system can do so by repeatedly processing the given intermediate representation using the encoder to generate the one or more latent representations.

The system generates a respective improved latent representation (454) for each of the one or more latent representations.

Briefly, for each of the one or more latent representations, generating a corresponding improved latent representation involves performing one or more improvement steps. Each improvement step in turn includes processing the latent representation using the regressors (256) and determining an update to the latent representation (458).

More specifically, the system processes the latent representation using the regressors (456) to generate respective predicted values of the one or more output characteristics of the IC (as of the improvement step).

The system then determines an update to the latent representation (458) that improves the respective predicted values of the one or more output characteristics generated by the regressors.

Specifically, in implementations where in output characteristics include runtime and energy consumption, the system computes an improvement objective function (as of the improvement step) which evaluates (i) a measure of difference between the predicted value and the desired value of the runtime, and (ii) a measure of difference between predicted value and the desired value of the energy consumption. The desired values can be either fixed or adjustable, i.e., by a user of the system. In various scenarios, the output characteristics can have different impact on the performance of the computer program. To better account for such differences, when computing the improvement objective function, the system can assign different weights to the respective measures of difference.

Because the latent representation is in a continuous domain, the system can then perform the improvement by using an appropriate continuous optimization technique and based on a determined gradient of the improvement objective function. Stochastic gradient descent (SGD) algorithm, Newton methods, or Newton-like methods are example of such continuous optimization techniques. The system computes the gradient of the improvement objective function with respect to the latent variables specified by the latent representation.

After the one or more improvement steps have been performed for each of the one or more sampled latent representations, i.e., after generating one or more improved latent representations, the system can proceed to select (460) a selected improved latent representation from the one or more improved latent representations.

In some implementations, the selected improved latent representation corresponds to the improved latent representation from which the respective predicted values of the one or more output characteristics generated by the regressors can satisfy one or more predetermined criteria. For example, one criterion may specify that the predicted values of either runtime, energy consumption, or both have to be below respective predetermined thresholds. As another example, one criterion may specify that the predicted values of either runtime, energy consumption, or both have to be improved at least by a predetermined amount when compared with the initial values predicted from the corresponding latent representation before improvement.

The system generates an output that specifies the final intermediate representation (462). The system can do so by processing the selected improved latent representation using the decoder. Specifically, the decoder processes the selected improved latent representation to generate an output that specifies the final intermediate representation of the given computer program. The final intermediate representation may, and generally will, be different from the intermediate representation that is specified by the received input.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method comprising:
obtaining data that specifies discrete input values of one or more input characteristics of an integrated circuit (IC);
generating an initial latent representation of the one or more input characteristics from the received data, wherein the initial latent representation is in a latent space;
generating an improved latent representation from the initial latent representation by performing one or more improvement steps in the latent space, wherein generating the improved latent representation comprises, at each of one or more improvement steps:
for each of one or more output characteristics of the IC that measure a performance of the IC, processing a current latent representation using a regressor model that corresponds to the output characteristic to generate a current predicted value of the output characteristic as of the improvement step; and
determining, using a continuous optimization technique, an update to the current latent representation that improves the current predicted values of the one or more output characteristics; and
generating data that specifies final discrete input values of the one or more input characteristics of the IC from the improved latent representation.

2. The method of claim 1, wherein generating the initial latent representation of the one or more input characteristics from the received data comprises:
processing the discrete input values of the one or more input characteristics of the IC using an encoder neural network in accordance with encoder network parameters.

3. The method of claim 1, wherein generating the data that specifies final discrete input values of the one or more input characteristics of the IC from the improved latent representation comprises:
processing the improved latent representation using a decoder neural network in accordance with decoder network parameters.

4. The method of claim 1, wherein determining the update to the current latent representation comprises:
computing an improvement objective function which evaluates, for each of the one or more output characteristics of the IC that measure the performance of the IC, a measure of difference between (i) the current predicted value of the output characteristic as of the improvement step and (ii) a desired value of the output characteristic.

5. The method of claim 4, wherein determining the update to the current latent representation comprises:
computing a gradient of the improvement objective function with respect to latent variables included in the current latent representation; and
determining one or more updates to the latent variables included in the current latent representation based on the gradient and by using a gradient descent-based optimization technique.

6. The method of claim 4, wherein the desired values of the one or more output characteristics are user-specified.

7. The method of claim 1, wherein the IC is at least part of a special purpose hardware circuit that is configured to perform specialized computations.

8. The method of claim 1, wherein the IC is at least part of a general purpose hardware circuit.

9. The method of claim 1, wherein the input characteristics characterize one or more of: a bandwidth of the IC, a memory of the IC, or a compute of the IC.

10. The method of claim 1, wherein the output characteristics characterize one or more of: an area of the IC or a runtime of the IC.

11. The method of claim 1, wherein obtaining data that specifies discrete input values of one or more input characteristics of the IC comprises:
receiving initial input values of the one or more input characteristics of the IC from a user.

12. The method of claim 1, wherein obtaining data that specifies discrete input values of one or more input characteristics of the IC comprises:
determining random input values of the one or more input characteristics of the IC.

13. One or more computer-readable storage media storing instructions that when executed by one or more computers cause the one or more computers to perform operations comprising:
obtaining data that specifies discrete input values of one or more input characteristics of an integrated circuit (IC);
generating an initial latent representation of the one or more input characteristics from the received data, wherein the initial latent representation is in a latent space;
generating an improved latent representation from the initial latent representation by performing one or more improvement steps in the latent space, wherein generating the improved latent representation comprises, at each of one or more improvement steps:
for each of one or more output characteristics of the IC that measure a performance of the IC, processing a current latent representation using a regressor model that corresponds to the output characteristic to generate a current predicted value of the output characteristic as of the improvement step; and
determining, using a continuous optimization technique, an update to the current latent representation that improves the current predicted values of the one or more output characteristics; and
generating data that specifies final discrete input values of the one or more input characteristics of the IC from the improved latent representation.

14. A system comprising one or more computers and one or more storage devices storing instructions that when executed by one or more computers cause the one or more computers to perform operations comprising:
obtaining data that specifies discrete input values of one or more input characteristics of an integrated circuit (IC);
generating an initial latent representation of the one or more input characteristics from the received data, wherein the initial latent representation is in a latent space;
generating an improved latent representation from the initial latent representation by performing one or more improvement steps in the latent space, wherein generating the improved latent representation comprises, at each of one or more improvement steps:
for each of one or more output characteristics of the IC that measure a performance of the IC, processing a current latent representation using a regressor model that corresponds to the output characteristic to generate a current predicted value of the output characteristic as of the improvement step; and determining, using a continuous optimization technique, an update to the current latent representation that improves the current predicted values of the one or more output characteristics; and generating data that specifies final discrete input values of the one or more input characteristics of the IC from the improved latent representation.

15. The system of claim 14, wherein generating the initial latent representation of the one or more input characteristics from the received data comprises:

processing the discrete input values of the one or more input characteristics of the IC using an encoder neural network in accordance with encoder network parameters.

16. The system of claim 14, wherein generating the data that specifies final discrete input values of the one or more input characteristics of the IC from the improved latent representation comprises:

processing the improved latent representation using a decoder neural network in accordance with decoder network parameters.

17. The system of claim 14, wherein determining the update to the current latent representation comprises:

computing an improvement objective function which evaluates, for each of the one or more output characteristics of the IC that measure the performance of the IC, a measure of difference between (i) the current predicted value of the output characteristic as of the improvement step and (ii) a desired value of the output characteristic.

18. The system of claim 17, wherein determining the update to the current latent representation comprises:

computing a gradient of the improvement objective function with respect to latent variables included in the current latent representation; and determining one or more updates to the latent variables included in the current latent representation based on the gradient and by using a gradient descent-based optimization technique.

19. The system of claim 17, wherein the desired values of the one or more output characteristics are user-specified.

20. The system of claim 14, wherein the IC is one of:

at least part of a special purpose hardware circuit that is configured to perform specialized computations, or at least part of a general purpose hardware circuit.

* * * * *